(12) United States Patent
Wu

(10) Patent No.: US 12,671,434 B2
(45) Date of Patent: Jun. 30, 2026

(54) ANALOG-TO-DIGITAL CONVERSION CIRCUIT AND ANALOG-TO-DIGITAL CONVERSION METHOD THEREOF COMBINING SUCCESSIVE APPROXIMATION PROCEDURE AND INITIAL VOLTAGE SCANNING PROCEDURE

(71) Applicant: Nuvoton Technology Corporation, Hsinchu Science Park (TW)

(72) Inventor: Hao-Wei Wu, Hsinchu Science Park (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 133 days.

(21) Appl. No.: 18/910,119

(22) Filed: Oct. 9, 2024

(65) Prior Publication Data

US 2025/0247104 A1     Jul. 31, 2025

(30) Foreign Application Priority Data

Jan. 31, 2024    (TW) ................................. 113103639

(51) Int. Cl.
*H03M 1/46*          (2006.01)
*H03M 1/12*          (2006.01)
*H03M 1/38*          (2006.01)

(52) U.S. Cl.
CPC .............. *H03M 1/462* (2013.01); *H03M 1/12* (2013.01); *H03M 1/38* (2013.01); *H03M 1/466* (2013.01)

(58) Field of Classification Search
CPC ........ H03M 1/462; H03M 1/466; H03M 1/38; H03M 1/12; H03M 1/06
See application file for complete search history.

(56) References Cited

U.S. PATENT DOCUMENTS 8,188,902 B2    5/2012  Mitikiri et al.
9,705,520 B1    7/2017  Kumar et al.
(Continued)

FOREIGN PATENT DOCUMENTS

CN        114095019 A        2/2022
CN        117335798 A        1/2024
TW        201025868 A        7/2010

OTHER PUBLICATIONS

Office Action (with Search Report) issued in corresponding TW application No. 113103639 dated Dec. 17, 2024 (6 pages).

*Primary Examiner* — Joseph J Lauture
(74) *Attorney, Agent, or Firm* — MUNCY, GEISSLER, OLDS & LOWE, P.C.

(57)          ABSTRACT

An analog-to-digital conversion circuit configured to convert an input voltage into a digital code includes a trigger controller, a comparison circuit, a successive approximation controller, and an initial voltage scanning controller. The trigger controller enables the first enable signal and the second enable signal in sequence. The comparison circuit selects a successive approximation code or a scan code to generate a conversion voltage and compares the conversion voltage with the input voltage to generate a comparison result. The successive approximation controller updates the successive approximation code based on the enabled first enable signal and the comparison result. The initial voltage scanning controller sets the initial value based on the digital code, and updates the scan code based on the enabled second enable signal and the comparison result.

20 Claims, 4 Drawing Sheets

(56)     References Cited

U.S. PATENT DOCUMENTS

| 2012/0154194 | A1 | 6/2012 | Chang et al. |
| 2013/0135125 | A1 | 5/2013 | Schreiner et al. |
| 2021/0234548 | A1* | 7/2021 | Tangirala .............. H03M 1/468 |

* cited by examiner

1

ANALOG-TO-DIGITAL CONVERSION CIRCUIT AND ANALOG-TO-DIGITAL CONVERSION METHOD THEREOF COMBINING SUCCESSIVE APPROXIMATION PROCEDURE AND INITIAL VOLTAGE SCANNING PROCEDURE

CROSS REFERENCE TO RELATED APPLICATIONS

This application claims priority of Taiwan Patent Application No. 113103639, filed on Jan. 31, 2024, the entirety of which is incorporated by reference herein.

BACKGROUND OF THE INVENTION

Field of the Invention

The disclosure is generally related to an analog-to-digital conversion circuit and an analog-to-digital conversion method, and more particularly it is related to an analog-to-digital conversion circuit and an analog-to-digital conversion method that combine a successive approximation procedure and an initial voltage scanning procedure.

Description of the Related Art

Non-rechargeable button batteries (CR2025) are widely used in personal computers, and most personal computers have a detection circuit to detect the voltage of the button battery to know whether the button battery still has power. Since button batteries are non-rechargeable, and button batteries can be regarded as large capacitors with the ability to maintain voltage, the battery voltage may remain unchanged or even increase slightly, or it may gradually decrease over time. Therefore, efficient analog-to-digital conversion circuits and analog-to-digital conversion methods are needed to measure the voltage of button batteries more efficiently.

BRIEF SUMMARY OF THE INVENTION

In an embodiment, an analog-to-digital conversion circuit for converting an input voltage into a digital code comprises a trigger controller, a comparison circuit, a successive approximation controller, an initial voltage scanning controller, and a termination controller. The trigger controller is configured to enable a first enable signal and a second enable signal in sequence. The comparison circuit is configured to select a successive approximation code or a scan code to generate a conversion voltage and configured to compare the conversion voltage with the input voltage to generate a comparison result. The successive approximation controller is configured to update the successive approximation code based on the first enable signal that is enabled and the comparison result. When the comparison result changes, the successive approximation controller enables a first termination signal. The initial voltage scanning controller is configured to set an initial value based on the digital code and update a scan code based on the second enable signal that is enabled and the comparison result. When the comparison result changes, the initial voltage scanning controller enables a second termination signal. The termination controller is configured to set the successive approximation code as the digital code based on the first termination signal that is enabled and set the scan code as the digital code based on the second termination signal that is enabled.

In another embodiment, an analog-to-digital conversion method for converting an input voltage to a digital code is provided. The analog-to-digital conversion method comprises the following steps. A successive approximation procedure is executed to obtain a successive approximation code corresponding to the input voltage. The successive code corresponding to the input voltage is set as the digital code. An initial value is set based on the digital code. An initial voltage scanning procedure using the initial value to obtain a scan code corresponding to the input voltage. The scan code corresponding to the input voltage is set to the digital code.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
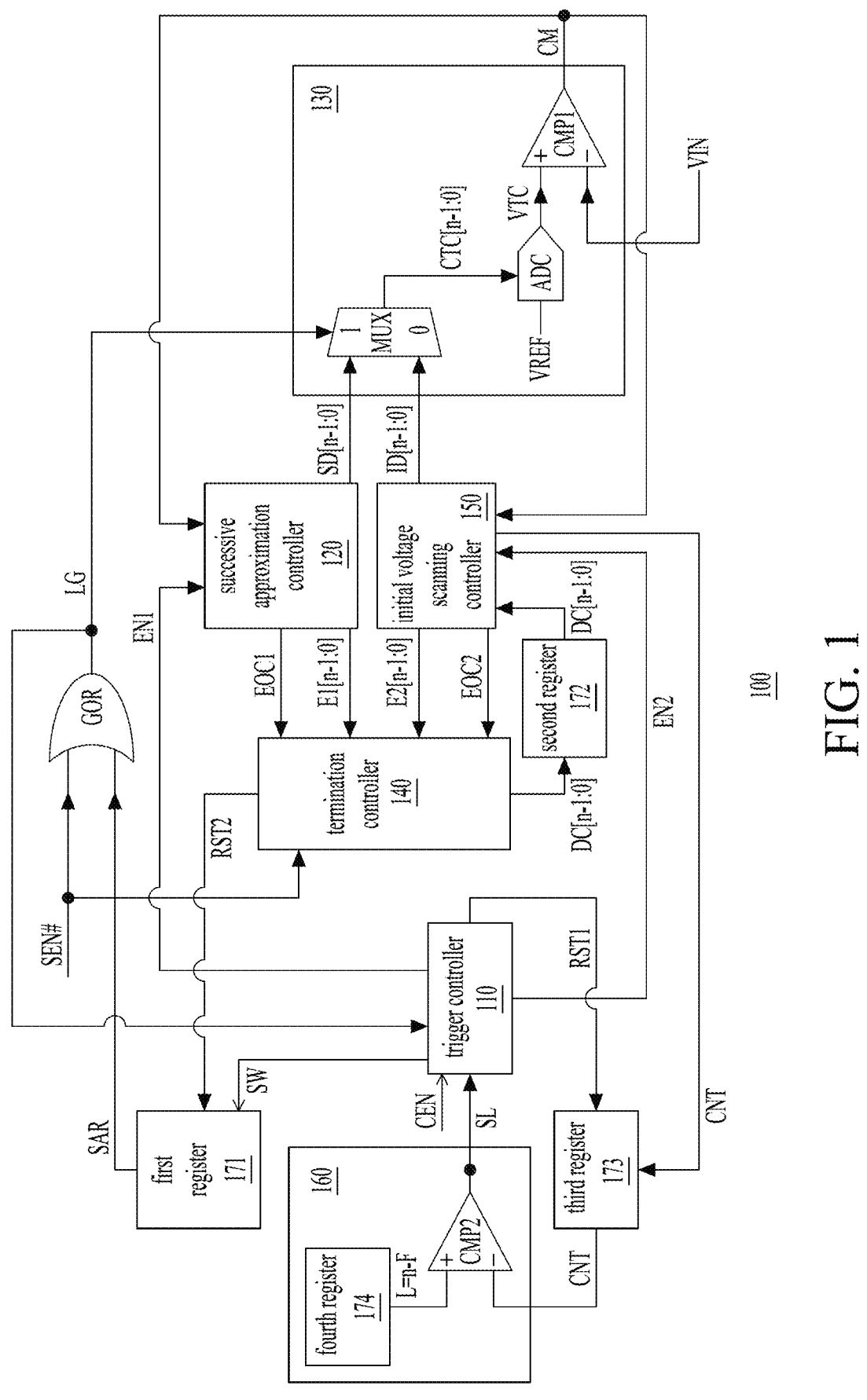
FIG. 1 is a block diagram showing an analog-to-digital conversion circuit in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the drawings, similar elements and/or features may have the same reference number. Various components of the same type can be distinguished by adding letters or numbers after the component symbol to distinguish similar components and/or similar features.

FIG. 1 is a block diagram showing an analog-to-digital conversion circuit in accordance with an embodiment of the present invention, in which the analog-to-digital conversion circuit 100 is configured to convert the input voltage VIN into a digital code DC[n−1:0]. As shown in FIG. 1, the analog-to-digital conversion circuit 100 includes a trigger controller 110, a successive approximation controller 120, a comparison circuit 130, a termination controller 140, and an initial voltage scanning controller 150.

When the external enable signal CEN is enabled, the trigger controller 110 enables the first enable signal EN1 based on the setting signal SEN # being in the disabled state or the successive approximation signal SAR being in the enabled state. According to an embodiment of the present invention, the external enable signal CEN is provided by an external host. According to the embodiment of FIG. 1, when the setting signal SEN # is in the disabled state, the setting signal SEN # is at a high logic level; when the setting signal SEN # is in the enabled state, the setting signal SEN # is at a low logic level. According to the embodiment of FIG. 1, when the successive approximation signal SAR is in the enabled state, the successive approximation signal SAR is at a high logic level; when the successive approximation signal SAR is in the disabled state, the successive approximation signal SAR is at a low logic level. Logic level. The logic levels of the setting signal SEN # and the successive approximation signal SAR are explained based on the embodiment in FIG. 1 and are not limited thereto in any form. According to an embodiment of the present invention, the setting signal SEN # is set by the user.

As shown in FIG. 1, the analog-to-digital conversion circuit 100 further includes an OR gate GOR for performing a logical OR operation on the setting signal SEN # and the successive approximation signal SAR to generate a logic signal LG. When the logic signal LG is at a high logic level, it means that the setting signal SEN # is in a disabled state (i.e., a high logic level) or the successive approximation signal SAR is in an enabled state (i.e., a high logic level). In other words, the trigger controller 110 enables the first enable signal EN1 based on the logic signal LG being at a high logic level.

Based on the enabled first enable signal EN1, the successive approximation controller 120 executes a successive approximation procedure to generate a successive approximation code SD[n−1:0], where n is a positive integer. The comparison circuit 130 converts the successive approximation code SD[n−1:0] into the conversion voltage VTC, and compares the conversion voltage VTC with the input voltage VIN to generate a comparison result CM. In the successive approximation procedure, the successive approximation controller 120 continuously updates the successive approximation code SD[n−1:0] based on the comparison result CM to generate the first termination code E1[$n$−1:0] corresponding to the input voltage VIN, so as to enable the first termination signal EOC1.

In other words, when the successive approximation controller 120 executes the successive approximation procedure, the number of bits of the successive approximation code SD[n−1:0] is adjusted by no more than 2 bits during each iteration, and the next bit of the successive approximation code SD[n−1:0] is adjusted through the comparison result CM. Therefore, when the successive approximation code SD[n−1:0] is n-bit, the comparison circuit 130 must compare the voltage corresponding to the successive approximation code SD[n−1:0] and the input voltage VIN by n times to obtain the successive approximation code SD[n−1:0] corresponding to the input voltage VIN. In addition, the successive approximation procedure can scan the digital code DC[n−1:0] corresponding to the input voltage VIN within the maximum range.

As shown in FIG. 1, the analog-to-digital conversion circuit 100 further includes a first register 171 and a second register 172. The first register 171 is configured to store the successive approximation signal SAR, and the second register 172 is configured to store the digital code DC[n−1:0].

As shown in FIG. 1, the comparison circuit 130 includes a multiplexer MUX, a digital-to-analog converter ADC, and a first comparator CMP1. Based on the logic signal LG, the multiplexer MUX selects either the successive approximation codes SD[n−1:0] or the scan code ID[n−1:0] as the conversion code CTC[n−1:0]. In other words, when the logic signal LG is at a high logic level, the successive approximation code SD[n−1:0] is selected as the conversion code CTC[n−1:0]; when the logic signal LG is at a low logic level, the scan code ID[n−1:0] is selected as the conversion code CTC[n−1:0]. The digital-to-analog converter ADC converts the conversion code CTC[n−1:0] into the conversion voltage VTC based on the reference voltage VREF. The first comparator CMP1 compares the conversion voltage VTC and the input voltage VIN to generate a comparison result CM.

According to an embodiment of the present invention, when the input voltage VIN is greater than the conversion voltage VTC, the comparison result CM is in the first state. According to another embodiment of the present invention, when the input voltage VIN is less than the conversion voltage VTC, the comparison result CM is in the second state. In the embodiment shown in FIG. 1, the first state is a high logic level and the second state is a low logic level. In other words, based on the status of the comparison result CM, the successive approximation controller 120 learns the relationship between the voltage corresponding to the successive approximation code SD[n−1:0] and the input voltage VIN, and then adjusts the successive approximation code SD[n−1:0] to generate the first termination code E1[$n$−1:0].

According to an embodiment of the present invention, when the first enable signal EN1 is enabled and the comparison result CM is in the first state, the successive approximation controller 120 increases the successive approximation code SD[n−1:0], causing the conversion voltage VTC to increase accordingly. According to another embodiment of the present invention, when the comparison result CM transitions from the first state to the second state, the successive approximation controller 120 decreases the successive approximation code SD[n−1:0], so that the conversion voltage VTC decreases accordingly. When the successive approximation procedure executed by the successive approximation controller 120 ends, the successive approximation controller 120 stores the successive approximation code SD[n−1:0] as the first termination code E1[n−1:0], and the successive approximation controller 120 enables the first termination signal EOC1.

According to an embodiment of the present invention, when the first termination signal EOC1 is enabled, the termination controller 140 disables the successive approximation signal SAR (i.e., a low logic level) by the second reset signal RST2 based on the enabled setting signal SEN # (i.e., low logic level). When the analog-to-digital conversion circuit 100 is enabled by the external enable signal CEN again, the trigger controller 110 disables the first enable signal EN1 and enables the second enable signal EN2 based on the logic signal LG being at a low logic level.

Based on the enabled second enable signal EN2, the initial voltage scanning controller 150 executes the initial voltage scanning procedure and sets the initial value of the scan code ID[n−1:0]. The multiplexer MUX of the comparison circuit 130 selects the scan code ID[n−1:0] as the conversion code CTC[n−1:0] based on the logic signal LG which is at a low logic level. The digital-to-analog converter ADC converts the conversion code CTC[n−1:0] into the conversion voltage VTC, so that the conversion voltage VTC is compared with the the input voltage VIN to generate the comparison result CM. Based on the change of the comparison result CM, the initial voltage scanning controller 150 obtains the scan code ID[n−1:0] corresponding to the input voltage VIN, sets the scan code ID[n−1:0] as the second termination code E2[n−1:0], and enables the second termination signal EOC2. Based on the enabled second termination signal EOC2, the termination controller 140 stores the second termination code E2[n−1:0] in the second register 172 as the digital code DC[n−1:0].

In addition, the initial voltage scanning controller 150 further counts a count value CNT for counting the number of times that the initial voltage scanning controller 150 updates the scan code ID[n−1:0]. As shown in FIG. 1, the analog-to-digital conversion circuit 100 further includes a third register 173, where the third register 173 is configured to store the count value CNT. According to an embodiment of the present invention, whenever the trigger controller 110 is enabled by the external enable signal CEN, the trigger controller 110 uses the first reset signal RST1 to zero the count value CNT stored in the trigger controller 110.

As shown in FIG. 1, the analog-to-digital conversion circuit 100 further includes a limit circuit 160. The limit circuit 160 includes a fourth register 174 and a second comparator CMP2. The fourth register 174 is configured to store the limit value L, where the limit value L is the number of bits n of the digital code DC[n−1:0] minus the set value F. According to an embodiment of the present invention, the setting value F can be set by the user. According to some embodiments of the present invention, the number of bits n of the digital code DC[n−1:0] is equal to the number of executions required by the successive approximation controller 120 to generate the successive approximation code SD[n−1:0] corresponding to the input voltage VIN.

The second comparator CMP2 compares the count value CNT and the limit value L to generate a limit signal SL. According to an embodiment of the present invention, when the count value CNT is less than the limit value L, the second comparator CMP2 disables the limit signal SL. According to another embodiment of the present invention, when the count value CNT is not less than the limit value L, the second comparator CMP2 enables the limit signal SL. When the limit signal SL is enabled, the trigger controller 110 uses the write signal SW to set the successive approximation signal SAR stored in the first register 171 to the enabled state (i.e., a high logic level), and disables the initial voltage scanning controller 150 and also enables the successive approximation controller 120 based on the successive approximation signal SAR being in the enabled state.

The successive approximation procedure executed by the successive approximation controller 120 can perform a wide range comparison on the input voltage VIN to obtain the digital code DC[n−1:0] corresponding to the input voltage VIN. The initial voltage scanning procedure executed by the initial voltage scanning controller 150 scans the input voltage VIN near the voltage corresponding to the digital code DC[n−1:0] based on the digital code DC[n−1:0] obtained by the previous successive approximation controller 120 as the initial value. When the input voltage VIN does not change much, the initial voltage scanning procedure requires fewer times than the successive approximation procedure to obtain the digital code DC[n−1:0].

Therefore, the analog-to-digital conversion circuit 100 first performs a successive approximation procedure to get the digital code DC[n−1:0] corresponding to the input voltage VIN, and then uses the initial voltage scanning procedure with the previous digital code DC[n−1:0] as the initial value to scan a small range, which helps to increase the efficiency of scanning the digital code DC[n−1:0] corresponding to the input voltage VIN. In addition, when the number of times the initial voltage scanning procedure has been executed (i.e., the count value CNT) is not less than the limit value L, it means that the input voltage VIN has changed significantly, and the analog-to-digital conversion circuit 100 is forced to return to the successive approximation procedure for more efficient scanning of the input voltage VIN over a wide range.

When the input voltage VIN changes significantly and causes the initial voltage scanning controller 150 to update the scan code ID[n−1:0] no less than the limit value L, the trigger controller 110 reactivates the successive approximation controller 120, in order to scan the input voltage VIN in a wide range with a smaller number of executions. The detailed operations of the initial voltage scanning controller 150 will be described in detail below.

Figure 2:
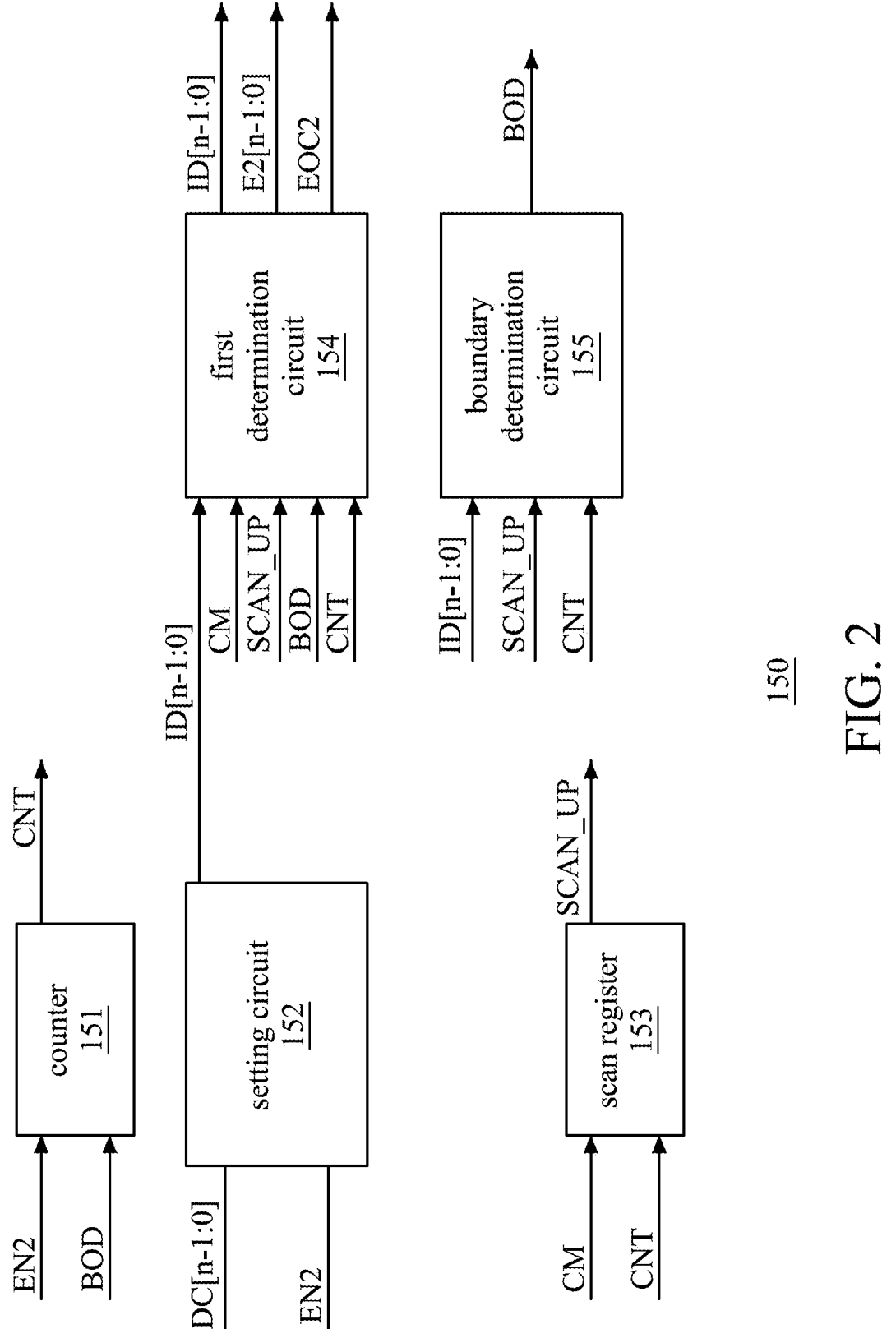
FIG. 2 is a block diagram showing an initial voltage scanning controller in accordance with an embodiment of the present invention.

FIG. 2 is a block diagram showing an initial voltage scanning controller in accordance with an embodiment of the present invention. As shown in FIG. 2, the initial voltage scanning controller 150 includes a counter 151, a setting circuit 152, a scan register 153, a first determination circuit 154, and a boundary determination circuit 155.

The counter 151 counts a count value CNT based on the enabled second enable signal EN2 and the boundary determination signal BOD, where the count value CNT is configured to count the number of times the initial voltage scanning controller 150 has been executed. The setting circuit 152 generates the scan code ID[n−1:0] based on the second enable signal EN2 and the digital code DC[n−1:0]. According to some embodiments of the present invention, when the second enable signal EN2 is enabled, the setting circuit 152 determines whether the digital code DC[n−1:0] is zero.

According to an embodiment of the present invention, when the digital code DC[n−1:0] is zero, the setting circuit 152 sets the initial value of the scan code ID[n−1:0] to 1, and the first determination circuit 154 receives the scan code ID[n−1:0] to disable the second termination signal EOC2. According to another embodiment of the present invention, when the digital code DC[n−1:0] is not zero, the setting circuit 152 sets the initial value of the scan code ID[n−1:0]

to the digital code DC[n−1:0], and disables the second termination signal EOC2 when the first determination circuit 154 receives the scan code ID[n−1:0].

The scan register 153 latches the comparison result CM based on the count value CNT to generate the scan signal SCAN_UP. According to an embodiment of the present invention, when the count value CNT is 1, the scan register 153 latches the comparison result CM as the scan signal SCAN_UP. According to an embodiment of the present invention, when the latched comparison result CM is in the first state (that is, the input voltage VIN is greater than the conversion voltage VTC), the scan signal SCAN_UP is in an increasing state. According to another embodiment of the present invention, when the latched comparison result CM is in the second state (i.e., the input voltage VIN is less than the conversion voltage VTC), the scan signal SCAN_UP is in the decreasing state.

The first determination circuit 154 updates the scan code ID[n−1:0], enables the second termination signal EOC2, and outputs the scan code ID[n−1:0] as the second termination code E2[n−1:0] based on the boundary determination signal BOD, the scan signal SCAN_UP, the comparison result CM, and the count value CNT. The boundary determination circuit 155 determines whether the scan code ID[n−1:0] exceeds the boundary based on the count value CNT to enable or disable the boundary determination signal BOD. According to an embodiment of the present invention, the count value CNT can be regarded as a clock signal of the initial voltage scanning controller 150 to trigger the scan register 153, the first determination circuit 154, and the boundary determination circuit 155 to start operating. According to some embodiments of the present invention, the upper limit of the scan code ID[n−1:0] is $2^n−1$, and the lower limit of the scan code ID[n−1:0] is 1.

According to an embodiment of the present invention, when the scan signal SCAN_UP is in the increasing state and the scan code ID[n−1:0] reaches the upper limit (i.e., $2^n−1$), the boundary determination circuit 155 determines that the scan code ID[n−1:0] reaches the boundary so as to enable the boundary determination signal BOD. According to another embodiment of the present invention, when the scan signal SCAN_UP is in the decreasing state and the scan code ID[n−1:0] reaches the lower limit (i.e., 1), the boundary determination circuit 155 determines that the scan code ID[n−1:0] reaches the boundary so as to enable the boundary determination signal BOD.

According to an embodiment of the present invention, when the boundary determination signal BOD is enabled, the counter 151 stops counting the count value CNT. According to an embodiment of the present invention, when the boundary determination signal BOD is enabled and the scan signal SCAN_UP is in an increasing state, the first determination circuit 154 maintains the scan code ID[n−1:0] (i.e., $2^n−1$), enables the second termination signal EOC2, and outputs the scan code ID[n−1:0] as the second termination code E2[n−1:0].

According to another embodiment of the present invention, when the boundary determination signal BOD is enabled and the scan signal SCAN_UP is in a decreasing state, the first determination circuit decreases the scan code ID[n−1:0] by 1 (i.e., to 0), enables the second termination signal EOC2, and outputs the updated scan code ID[n−1:0] as the second termination code E2[n−1:0]. Subsequently, the termination controller 140 in FIG. 1 sets the second termination code E2[n−1:0] to the digital code DC[n−1:0] based on the enabled second termination signal EOC2.

When the boundary determination signal BOD is disabled, the counter 151 increases the count value CNT by 1 and the first determination circuit 154 updates the scan code ID[n−1:0]. According to an embodiment of the present invention, when the boundary determination signal BOD is disabled and the scan signal SCAN_UP is in an increasing state, the first determination circuit 154 increments the scan code ID[n−1:0] by 1. According to another embodiment of the present invention, when the boundary determination signal BOD is disabled and the scan signal SCAN_UP is in a decreasing state, the first determination circuit 154 decrements the scan code ID[n−1:0] by 1.

When the boundary determination signal BOD is disabled and the scan code ID[n−1:0] is updated in the first determination circuit 154 (that is, when the scan signal SCAN_UP is in an increasing state, the scan code ID[n−1:0] plus 1, and when the scan signal SCAN_UP is in a decreasing state, the scan code ID[n−1:0] minus 1). After that, the first determination circuit 154 further determines the status of the scan signal SCAN_UP and the comparison result CM.

According to an embodiment of the present invention, when the scan signal SCAN_UP is in the increasing state and the comparison result CM is in the second state (i.e., the input voltage VIN is less than the conversion voltage VTC), the first determination circuit 154 decreases the scan code ID[n−1:0] by 1, and the first determination circuit 154 further sets the updated scan code ID[n−1:0] as the second termination code E2[n−1:0] to enable the second termination signal EOC2.

According to another embodiment of the present invention, when the scan signal SCAN_UP is in the decreasing state and the comparison result CM is in the first state (i.e., the input voltage VIN is greater than the conversion voltage VTC), the first determination circuit 154 maintains the scan code ID[n−1:0], and the first determination circuit 154 sets the updated scan code ID[n−1:0] as the second termination code E2[n−1:0] and enables the second termination signal EOC2.

Figure 3:
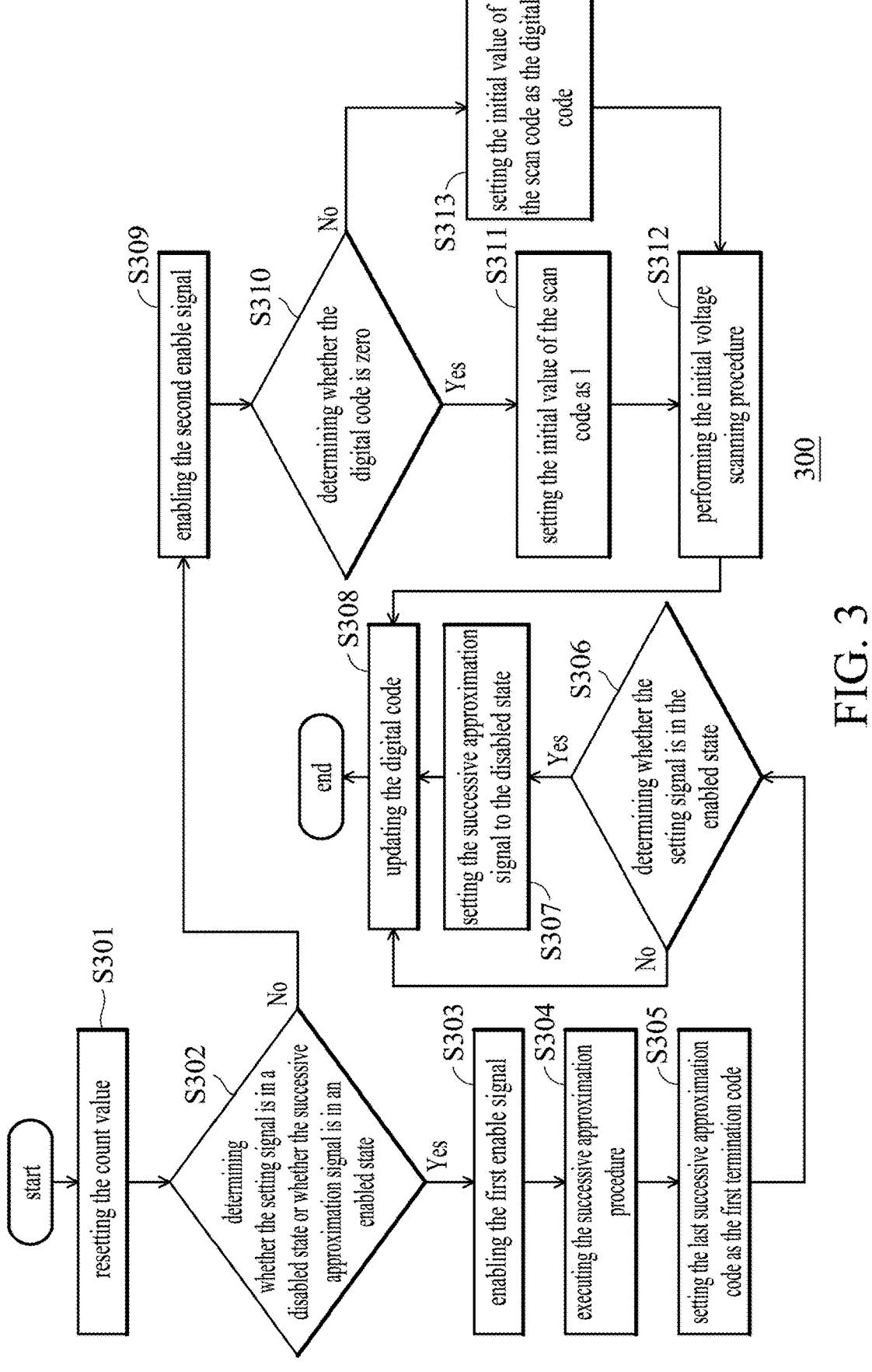
FIG. 3 is a flow chart showing an analog-to-digital conversion method in accordance with an embodiment of the present invention.

FIG. 3 is a flow chart showing an analog-to-digital conversion method in accordance with an embodiment of the present invention. The following description of the analog-to-digital conversion method 300 will be combined with the analog-to-digital conversion circuit 100 in FIG. 1 and the initial voltage scanning controller 150 in FIG. 2 to facilitate detailed explanation.

First, when the analog-to-digital conversion circuit 100 is enabled by the external enable signal CEN, the trigger controller 110 resets the count value CNT stored in the second register 172 to zero (step S301), and determines whether the setting signal SEN # is in a disabled state or whether the successive approximation signal SAR is in an enabled state (step S302). In other words, the trigger controller 110 in FIG. 1 determines whether the condition of step S302 is met based on the state of the logic signal LG.

When the determination in step S302 is yes (that is, the logic signal LG is a high logic level), the trigger controller 110 enables the first enable signal EN1 (step S303), and the successive approximation controller 120 executes the successive approximation procedure (step S304) to update the successive approximation code SD[n−1:0]. When the successive approximation controller 120 completes the successive approximation procedure, the successive approximation controller 120 sets the last successive approximation code SD[n−1:0] as the first termination code E1[n−1:0] (step S305).

According to an embodiment of the present invention, when the first enable signal EN1 is enabled and the comparison result CM is in the first state, the successive approximation controller 120 increases the successive approximation code SD[n−1:0], causing the conversion voltage VTC to increase accordingly. According to another embodiment of the present invention, when the comparison result CM transitions from the first state to the second state, the successive approximation controller 120 decreases the successive approximation code SD[n−1:0], so that the conversion voltage VTC decreases accordingly. When the successive approximation procedure executed by the successive approximation controller 120 ends, the successive approximation controller 120 stores the successive approximation code SD[n−1:0] as the first termination code E1[n−1:0], and the successive approximation controller 120 enables the first termination signal EOC1.

Next, the termination controller 140 determines whether the setting signal SEN # is in the enabled state (step S306). When it is determined that the setting signal SEN # is in the enabled state, the termination controller 140 uses the write signal SW to set the successive approximation signal SAR to the disabled state (step S307), and updates the digital code DC[n−1:0] by using the first termination code E1[n−1:0] based on the enabled first termination signal EOC1 (step S308). Subsequently, the analog-to-digital conversion method 300 ends.

When the analog-to-digital conversion circuit 100 is enabled by the external enable signal CEN again, step S301 and step S302 are executed again. Since the successive approximation signal SAR has been set to the disabled state (i.e., the low logic level), and the setting signal SEN # is in the enabled state (i.e., the low logic level), the determination in step S302 is No, and then step S309 is executed. In step S309, the trigger controller 110 disables the first enable signal EN1 and enables the second enable signal EN2.

The setting circuit 152 in FIG. 2 determines whether the digital code DC[n−1:0] is zero based on the enabled second enable signal EN2 (step S310). When it is determined in step S310 that the digital code DC[n−1:0] is zero, the setting circuit 152 sets the initial value of the scan code ID[n−1:0] as 1 (step S311), and performs the initial voltage scanning procedure (step S312). When it is determined in step S310 that the digital code DC[n−1:0] is not zero, the setting circuit 152 sets the initial value of the scan code ID[n−1:0] as the digital code DC[n−1:0] (step S313), and then executes the initial voltage scanning procedure (step S312).

In step S312, the first determination circuit 154 scans the scan code ID[n−1:0] corresponding to the input voltage VIN based on the initial value of the scan code ID[n−1:0], and stores the scan code ID[n−1:0] corresponding to the input voltage VIN as the second termination code E2[n−1:0]. Returning to step S308 after step S312, the termination controller 140 updates the second register 172 with the second termination code E2[n−1:0], which is the digital code DC[n−1:0]. The detailed operation process of the initial voltage scanning procedure will be described in detail below.

Figure 4:
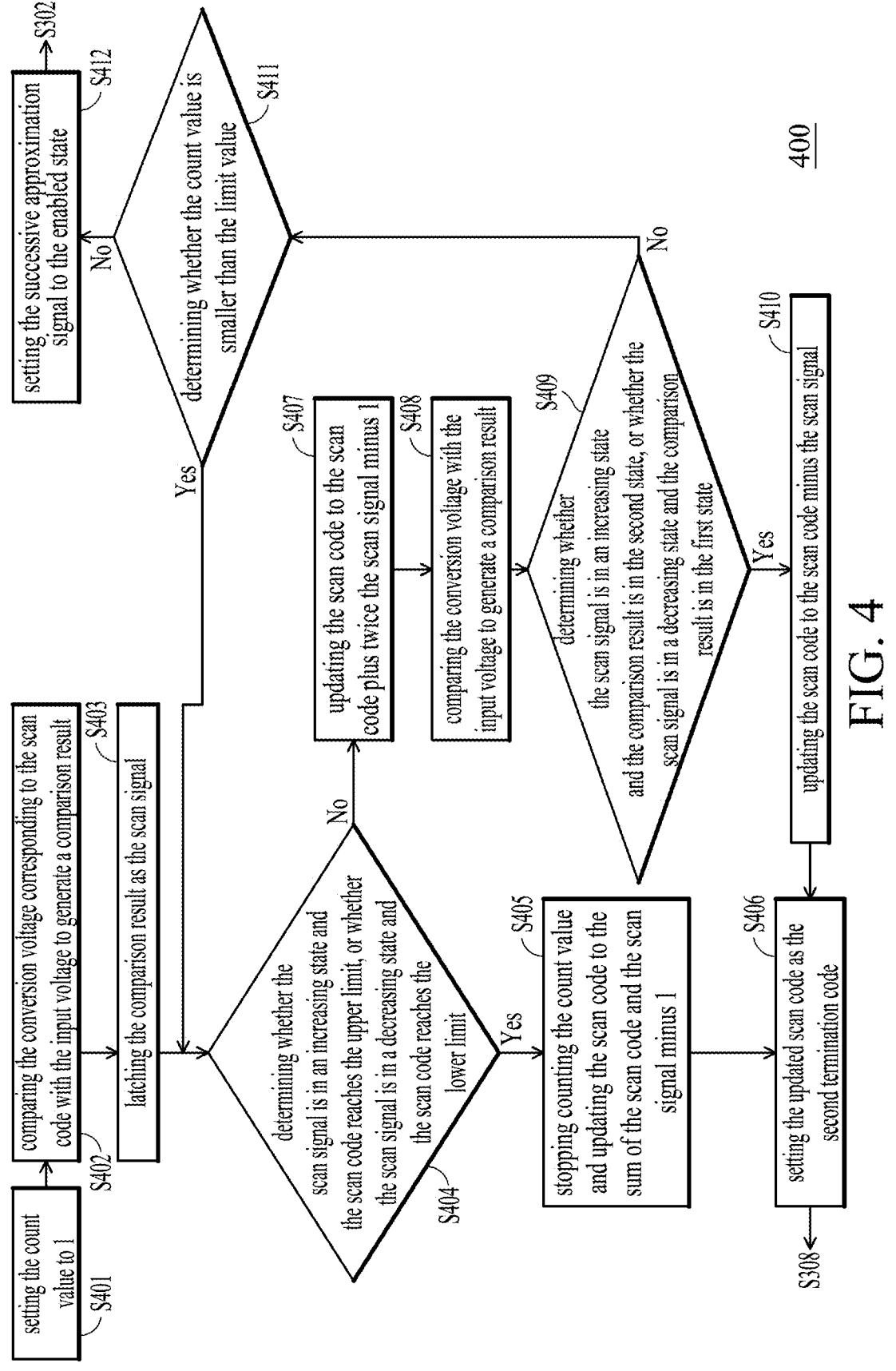
FIG. 4 is a flow chart showing an initial voltage scanning procedure in accordance with an embodiment of the present invention.

FIG. 4 is a flow chart showing an initial voltage scanning procedure in accordance with an embodiment of the present invention. The following description of the initial voltage scanning procedure 400 will be combined with the analog-to-digital conversion circuit 100 in FIG. 1 and the initial voltage search controller 150 in FIG. 2 to facilitate detailed explanation.

First, the counter 151 sets the count value CNT to 1 based on the enabled second enable signal EN2 (step S401). The comparison circuit 130 compares the conversion voltage VTC generated by the scan code ID[n−1:0] with the input voltage VIN to generate a comparison result CM (step S402). Next, when the count value CNT is 1, the scan register 153 latches the comparison result CM as the scan signal SCAN_UP (step S403).

According to an embodiment of the present invention, when the input voltage VIN is greater than the conversion voltage VTC corresponding to the scan code ID[n−1:0], the comparison result CM is in the first state. According to another embodiment of the present invention, when the input voltage VIN is less than the conversion voltage VTC corresponding to the scan code ID[n−1:0], the comparison result CM is in the second state. According to an embodiment of the present invention, when the latched comparison result CM is in the first state, the scan signal SCAN_UP is in the increasing state. According to another embodiment of the present invention, when the latched comparison result CM is in the second state, the scan signal SCAN_UP is in the decreasing state.

Next, the boundary determination circuit 155 determines the status of the scan signal SCAN_UP and the scan code ID[n−1:0] to generate the boundary determination signal BOD (step S404). In step S404, the boundary determination circuit 155 determines whether the scan signal SCAN_UP is in an increasing state and the scan code ID[n−1:0] reaches the upper limit, or whether the scan signal SCAN_UP is in a decreasing state and the scan code ID[n−1:0] reaches the lower limit. According to an embodiment of the present invention, the upper limit of the scan code ID[n−1:0] is $2^n-1$, and the lower limit of the scan code ID[n−1:0] is 1.

When the determination in step S404 is yes, the counter 151 stops counting the count value CNT, and the first determination circuit 154 updates the scan code ID[n−1:0] so that it is equal to the sum of the scan code ID[n−1:0] and the scan signal SCAN_UP minus 1 (step S405). That is, ID[n−1:0]=ID[n−1:0]+SCAN_UP−1. When the scan signal SCAN_UP is in an increasing state (i.e., a high logic level), the scan code ID[n−1:0] remains unchanged. When the scan signal SCAN_UP is in a decreasing state (i.e., a low logic level), the first determination circuit 154 decreases the scan code ID[n−1:0] by 1 in step S404.

When the scan signal SCAN_UP is in the increasing state and the scan code ID[n−1:0] reaches $2^n-1$, it means that the actual input voltage VIN exceeds the upper limit of the scan code ID[n−1:0]. The initial voltage scanning procedure should be stopped and the upper limit of the scan code ID[n−1:0] should be set to the second termination code E2[n−1:0]. When the scan signal SCAN_UP is in the decreasing state and the scan code ID[n−1:0] reaches 1, it means that the input voltage VIN corresponding to the scan code ID[n−1:0] should be zero, and there is no need to go through the comparison circuit 130. Therefore, the second termination code E2[n−1:0] can be directly set to zero.

When the determination in step S404 is NO, the counter 151 increases the count value CNT by 1, and the first determination circuit 154 updates the scan code ID[n−1:0] to the scan code ID[n−1:0] plus twice the scan signal SCAN_UP minus 1 (step S407). That is, ID[n−1:0]=ID[n−1:0]+ (2*SCAN_UP−1). In other words, when the scan signal SCAN_UP is in the increasing state, the first determination circuit 154 increases the scan code ID[n−1:0] by 1 in step S407. When the scan signal SCAN_UP is in the decreasing state, the first determination circuit 154 decreases the scan code ID[n−1:0] by 1 in step S407.

Returning to step S405, the first determination circuit 154 then sets the updated scan code ID[n−1:0] as the second termination code E2[n−1:0] (step S406), enables the first Second termination signal EOC2, and also returns to step S308 to set the second termination code E2[n−1:0] to the digital code DC[n−1:0]. Returning to step S407, the comparison circuit 130 then converts the scan code ID[n−1:0] updated in step S407 into the conversion voltage VTC, and compares the conversion voltage VTC with the input voltage VIN to generate a comparison result CM (step S408).

Subsequently, the first determination circuit 154 determines whether the scan signal SCAN_UP is in an increasing state and the comparison result CM is in the second state, or whether the scan signal SCAN_UP is in a decreasing state and the comparison result CM is in the first state (step S409). When the scan signal SCAN_UP is in the increasing state and the comparison result CM is in the second state (that is, the input voltage VIN is less than the conversion voltage VTC), it means that the conversion voltage VTC corresponding to the scan code ID[n−1:0] continues to increase and has exceeded Input voltage VIN. When the scan signal SCAN_UP is in the decreasing state and the comparison result CM is in the first state (that is, the input voltage VIN is greater than the conversion voltage VTC), it means that the conversion voltage VTC corresponding to the scan code ID[n−1:0] continues to decrease and has been lower than the input voltage.

When the determination in step S409 is yes, the first determination circuit 154 updates the scan code ID[n−1:0] to the scan code ID[n−1:0] minus the scan signal SCAN_UP (step S410). That is, ID[n−1:0]=ID[n−1:0]-SCAN_UP. When the scan signal SCAN_UP is in an increasing state (i.e., a high logic level), the first determination circuit 154 updates the scan code ID[n−1:0] to the scan code ID[n−1:0] minus 1. When the scan signal SCAN_UP is in the decreasing state (i.e., low logic level), the first determination circuit 154 maintains the scan code ID[n−1:0] unchanged. After step S410, step S406 and step S308 are then executed, which will not be repeated herein.

When the determination in step S409 is NO, the limit circuit 160 in FIG. 1 determines whether the count value CNT is smaller than the limit value L (step S411). When step S411 determines yes, return to step S404. When the determination in step S411 is negative, the trigger controller 110 uses the write signal SW to set the successive approximation signal SAR stored in the first register 171 to the enabled state (i.e., a high logic level) (step S412). The initial voltage scanning procedure 400 is forced to end and returns to step S302 to enable the successive approximation controller 120 to use the successive approximation procedure to scan the digital code DC[n−1:0] corresponding to the input voltage VIN in a wider range.

According to an embodiment of the present invention, when the determination in step S411 is negative, it means that the initial voltage scanning procedure 400 cannot use fewer times than the successive approximation procedure to obtain the digital code DC[n−1:0] corresponding to the input voltage VIN, and the number of times required by the initial voltage scanning procedure 400 to scan the input voltage VIN in a wide range is much higher than that of the successive approximation procedure. Therefore, in step S412, the successive approximation signal SAR is set to the enabled state and returns to the successive approximation procedure. Returning to the successive approximation procedure is configured to obtain the digital code DC[n−1:0] corresponding to the input voltage VIN more efficiently.

The present invention first performs a successive approximation procedure on the input voltage to perform an efficient comprehensive scan to obtain the digital code corresponding to the input voltage. During the next scanning procedure and when the input voltage does not change significantly, the initial voltage scanning procedure is combined with the previous digital code obtained in the successive approximation procedure as the initial value to obtain the digital code corresponding to the input voltage more quickly. Even if the input voltage changes significantly and the number of executions required for the initial voltage scanning procedure exceeds expectations, the analog-to-digital conversion circuit and analog-to-digital conversion method proposed by the present invention can automatically switch to the successive approximation procedure to update the input voltage for efficiently scanning in a wider range. Furthermore, the user can execute the successive approximation procedure combined with the initial voltage scanning procedure, or only use the successive approximation procedure, by a setting signal.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An analog-to-digital conversion circuit for converting an input voltage into a digital code, comprising:
   a trigger controller, configured to enable a first enable signal and a second enable signal in sequence;
   a comparison circuit, configured to select a successive approximation code or a scan code to generate a conversion voltage and compare the conversion voltage with the input voltage to generate a comparison result;
   a successive approximation controller, configured to update the successive approximation code based on the first enable signal that is enabled and the comparison result, wherein when the comparison result changes, the successive approximation controller enables a first termination signal;
   an initial voltage scanning controller, configured to set an initial value based on the digital code and update a scan code based on the second enable signal that is enabled and the comparison result, wherein when the comparison result changes, the initial voltage scanning controller enables a second termination signal; and
   a termination controller, configured to set the successive approximation code as the digital code based on the first termination signal that is enabled and set the scan code as the digital code based on the second termination signal that is enabled.

2. The analog-to-digital conversion circuit as claimed in claim 1, wherein when a successive approximation signal is in an enabled state or a setting signal is in a disabled state, the trigger controller enables the first enable signal and disables the second enable signal;

wherein when the setting signal is in the enabled state and the successive approximation signal is in the disabled state, the trigger controller enables the second enable signal and disables the first enable signal;

wherein the setting signal is determined by a user.

3. The analog-to-digital conversion circuit as claimed in claim 2, wherein the comparison circuit further comprises:

a multiplexer, configured to select the successive approximation code or the scan code as a conversion code;

a digital-to-analog converter, configured to convert the conversion code into the conversion voltage; and a comparator, configured to compare the conversion voltage and the input voltage to generate the comparison result;

wherein when the setting signal is in the enabled state and the successive approximation signal is in the disabled state, the multiplexer selects the scan code as the conversion code;

wherein when the setting signal is in the disabled state and the successive approximation signal is in the enabled state, the multiplexer selects the successive approximation code as the conversion code;

wherein when the input voltage exceeds the conversion voltage, the comparison result is in a first state;

wherein when the input voltage is less than the conversion voltage, the comparison voltage is in a second state.

4. The analog-to-digital conversion circuit as claimed in claim 3, wherein when the first enable signal is enabled and the comparison result is in the first state, the successive approximation controller increases the successive approximation code, so that the conversion voltage increases accordingly;

wherein when the comparison result is in the second state, the successive approximation controller decreases the successive approximation code, so that the conversion voltage decreases accordingly;

wherein when a successive approximation procedure executed by the successive approximation controller is complete, the successive approximation controller stores the successive approximation code as a first termination code and the successive approximation controller enables the first termination signal;

wherein the termination controller stores the first termination code as the digital code based on the first termination signal that is enabled, and the termination controller sets the successive approximation signal to the disabled state in response to the setting signal being in the enabled state.

5. The analog-to-digital conversion circuit as claimed in claim 3, wherein when the second enable signal is enabled, the initial voltage scanning controller determines whether the digital code is zero;

wherein when determining that the digital code is not zero, the initial voltage scanning controller sets the digital code as an initial value of the scan code and disables the second termination signal;

wherein when determining that the digital code is zero, the initial voltage scanning controller sets the scan code to 1 and disables the second termination signal.

6. The analog-to-digital conversion circuit as claimed in claim 5, wherein the initial voltage scanning controller further comprises:

a counter, configured to count a count value based on the second enable signal that is enabled and a boundary determination signal, wherein the count value is configured to count a number of executions of the initial voltage scanning controller;

a setting circuit, configured to generate the initial value of the scan code based on the digital code;

a scan register, wherein when the count value is 1, the scan register latches the comparison result as a scan signal;

a boundary determination circuit, configured to determine whether the scan code exceeds a boundary to enable or disable the boundary determination signal; and a first determination circuit, configured to update the scan code, enable the second termination signal, and output the scan code as a second termination code based on the boundary determination signal, the scan signal, and the comparison result;

wherein when the comparison result that is latched is in the first state, the scan signal is in an increasing state;

wherein when the comparison result that is latched is in the second state, the scan signal is in a decreasing state;

wherein when the scan signal is in the increasing state and the scan code reaches an upper limit or the scan signal is in the decreasing state and the scan code reaches a lower limit, the boundary determination circuit enables the boundary determination signal.

7. The analog-to-digital conversion circuit as claimed in claim 6, wherein when the digital code is zero, the setting circuit sets the initial value to 1;

wherein when the digital code is not zero, the setting circuit sets the initial value of the scan code as the digital code;

wherein when the boundary determination signal is enabled, the counter stops counting the count value;

wherein when the boundary determination signal is enabled and the scan signal is in the increasing state, the first determination circuit maintains the scan code, enables the second termination signal, and outputs the scan code as the second termination code;

wherein when the boundary determination signal is enabled and the scan signal is in the decreasing state, the first determination circuit decreases the scan code by 1, enables the second termination signal, and outputs the scan code as the second termination code;

wherein the termination controller sets the second termination code as the digital code based on the second termination signal that is enabled.

8. The analog-to-digital conversion circuit as claimed in claim 7, wherein when the boundary determination signal is disabled, the counter increases the count value by 1 and the first determination circuit updates the scan code;

wherein when the boundary determination signal is disabled and the scan signal is in the increasing state, the first determination circuit increases the scan code by 1;

wherein when the boundary determination signal is disabled and the scan signal is in the decreasing state, the first determination circuit decreases the scan code by 1.

9. The analog-to-digital conversion circuit as claimed in claim 8, wherein when the boundary determination signal is disabled and after the first determination circuit updates the scan code, the first determination circuit further determines the status of the scan signal and the comparison result;

wherein when the scan signal is in the increasing state and the comparison result is in the second state, the first determination circuit decreases the scan code by 1 and the first determination circuit sets the scan code that is updated as the second termination code and enables the second termination signal;

wherein when the scan signal is in the decreasing state and the comparison result is in the first state, the first determination circuit maintains the scan code and the first determination circuit sets the scan code that is updated as the second termination code and enables the second termination signal.

10. The analog-to-digital conversion circuit as claimed in claim 9, further comprising:

a limit circuit, configured to determine whether the count value is less than a limit value to enable a limit signal;

wherein the limit value is equal to a number of executions required by the successive approximation controller obtaining the successive approximation code corresponding to the input voltage minus a set value;

wherein the set value is set by a user;

wherein when the scan signal is in the increasing state and the comparison result is in the first state or the scan signal is in the decreasing state and the comparison result is in the second state, the limit circuit determines whether the count value is less than the limit value;

wherein when the count value is less than the limit value, the boundary determination circuit determines whether the scan code exceeds the boundary;

wherein when the count value exceeds the limit value, the limit circuit enables the limit signal;

wherein the trigger controller sets the successive approximation signal to the enabled state based on the limit signal that is enabled, and enables the first enable signal and disables the second enable signal based on the successive approximation signal being in the enabled state.

11. An analog-to-digital conversion method for converting an input voltage to a digital code, wherein the analog-to-digital conversion method comprises:

executing a successive approximation procedure to obtain a successive approximation code corresponding to the input voltage;

setting the successive code corresponding to the input voltage as the digital code;

setting an initial value based on the digital code;

executing an initial voltage scanning procedure with the initial value to obtain a scan code corresponding to the input voltage; and setting the scan code corresponding to the input voltage to the digital code.

12. The analog-to-digital conversion method as claimed in claim 11, wherein the step of setting the initial value based on the digital code comprises:

determining whether the digital code is zero;

when the digital code is zero, setting the initial value to 1; and when the digital code is not zero, setting the initial value to the digital code.

13. The analog-to-digital conversion method as claimed in claim 12, wherein the initial voltage scanning procedure comprises:

setting a count value to 1;

comparing a voltage corresponding to the scan code with the input voltage to generate a comparison result; and when the count value is 1, latching the comparison result as a scan signal.

14. The analog-to-digital conversion method as claimed in claim 13, wherein when the input voltage exceeds the voltage corresponding to the scan code, the comparison result is in a first state;

wherein when the input voltage is less than the voltage corresponding to the scan code, the comparison result is in a second state;

wherein when the comparison result that is latched is in the first state, the scan signal is in an increasing state;

wherein when the comparison result that is latched is in the second state, the scan signal is in a decreasing state.

15. The analog-to-digital conversion method as claimed in claim 14, wherein the initial voltage scanning procedure further comprises:

determining the status of the scan signal and the scan code;

when the scan signal is in the increasing state and the scan code reaches an upper limit or the scan signal is in the decreasing state and the scan code reaches a lower limit, stopping the counting of the count value and updating the scan code based on the scan signal;

after the step of updating the scan code based on the scan signal, setting the scan code that is updated as a second termination code;

setting the second termination code as the digital code;

when the scan signal is in the increasing state, maintaining the scan code; and when the scan signal is in the decreasing state, updating the scan code to the scan code minus 1.

16. The analog-to-digital conversion method as claimed in claim 15, wherein the lower limit is 1.

17. The analog-to-digital conversion method as claimed in claim 15, wherein the initial voltage scanning procedure further comprises:

when the scan signal is in the increasing state and the scan code does not reach the upper limit or the scan signal is in the decreasing state and the scan code does not reach the lower limit, adding 1 to the count value and updating the scan code based on the scan signal;

comparing the voltage corresponding to the scan code that is updated with the input voltage to generate the comparison result;

when the scan signal is in the increasing state, updating the scan code to the scan code plus 1; and when the scan signal is in the decreasing state, updating the scan code to the scan code minus 1.

18. The analog-to-digital conversion method as claimed in claim 17, wherein the initial voltage scanning procedure further comprises:

determining the status of the scan signal and the comparison result;

when the scan signal is in the increasing state and the comparison result is in the second state, updating the scan code to the scan code minus 1;

when the scan signal is in the decreasing state and the comparison result is in the first state, maintaining the scan code;

setting the scan code that is updated as a second termination code; and setting the second termination code as the digital code.

19. The analog-to-digital conversion method as claimed in claim 18, wherein the initial voltage scanning procedure further comprises:

when the scan signal is in the increasing state and the comparison result is in the first state or the scan signal is in the decreasing state and the comparison result is in the second state, determining whether the count value is less than a limit value;

wherein the limit value is equal to a number of executions required by the successive approximation procedure generating the successive approximation code corresponding to the input voltage minus a set value;

wherein the set value is set by a user.

20. The analog-to-digital conversion method as claimed in claim 19, wherein the initial voltage scanning procedure further comprises:

when the count value is less than the limit value, executing the step of determining the status of the scan signal and the scan code once again; and when the count value is not less than the limit value, ending the initial voltage scanning procedure and then executing the successive approximation procedure.

\*    \*    \*    \*    \*